US012767518B2

(12) United States Patent
Reinmuth et al.

(10) Patent No.: US 12,767,518 B2
(45) Date of Patent: Oct. 20, 2026

(54) MICROMECHANICAL DEVICE WITH A MECHANICAL STOP

(71) Applicant: Robert Bosch GmbH, Stuttgart (DE)

(72) Inventors: Jochen Reinmuth, Reutlingen (DE); Ralf Boessendoerfer, Dinkelsbuehl (DE); Robert Maul, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 350 days.

(21) Appl. No.: 18/645,478

(22) Filed: Apr. 25, 2024

(65) Prior Publication Data

US 2024/0425356 A1 Dec. 26, 2024

(30) Foreign Application Priority Data

Jun. 22, 2023 (DE) ..................... 10 2023 205 883.9

(51) Int. Cl.
*B81B 3/00* (2006.01)
*G01P 15/125* (2006.01)

(52) U.S. Cl.
CPC .......... *B81B 3/0051* (2013.01); *G01P 15/125* (2013.01); *B81B 2201/0235* (2013.01)

(58) Field of Classification Search
CPC ............................ B81B 3/0051; G01P 15/125
See application file for complete search history.

(56) References Cited

U.S. PATENT DOCUMENTS 11,697,583 B2 * 7/2023 Nagel .................. B81B 3/0027 74/110
2021/0341510 A1 * 11/2021 Classen ................ B81B 3/0051
2022/0326105 A1 * 10/2022 Tebje .................... G01L 9/0072
2023/0331544 A1 * 10/2023 Reinmuth ............ B81B 7/0016

FOREIGN PATENT DOCUMENTS

DE 19537814 A1 4/1997
DE 102009029095 A1 3/2011
DE 102016218661 A1 3/2018
DE 102011080978 B4 3/2020
JP 2015068686 A 4/2015

* cited by examiner

*Primary Examiner* — Eric S. McCall
(74) *Attorney, Agent, or Firm* — Norton Rose Fulbright US LLP

(57) ABSTRACT

A micromechanical device having a substrate with a main extension plane, a thin first functional layer over the substrate, and a thick second functional layer over the first functional layer. A fixed functional element and a movable functional element are formed in the second functional layer, The movable functional element is able to deflect in a first direction parallel to the main extension plane. The micromechanical device has a fixed stop element in the first functional layer, the movable functional element is also formed in the first functional layer and has a movable stop element there. The movable stop element can be applied to the fixed stop element when the movable functional element is deflected in the first direction.

5 Claims, 6 Drawing Sheets

Fig. 3C section
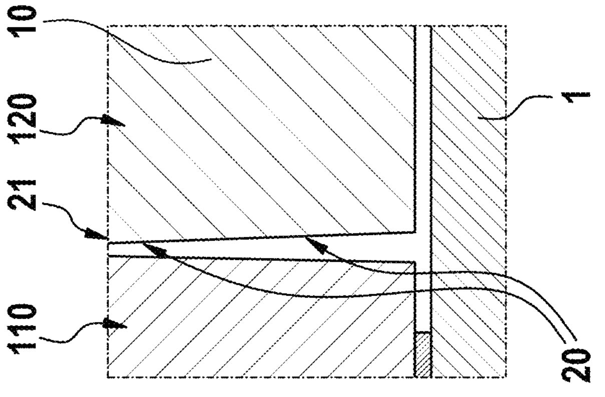
Fig. 3A Related Art
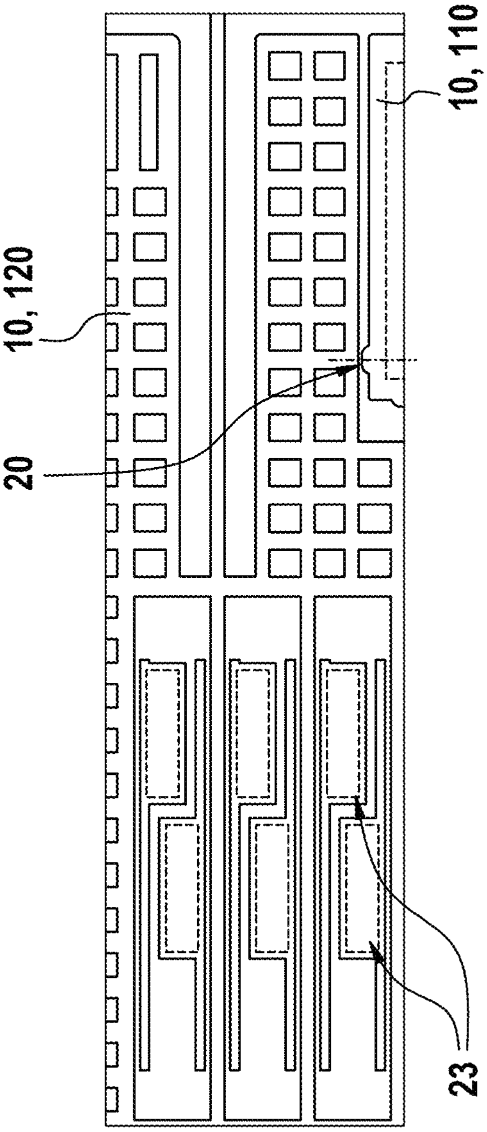
Fig. 3B
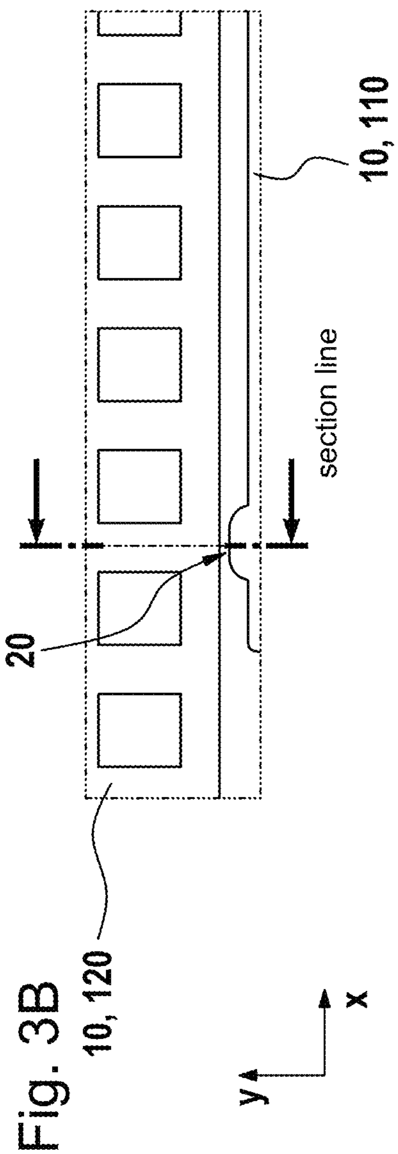

section

Fig. 6B section
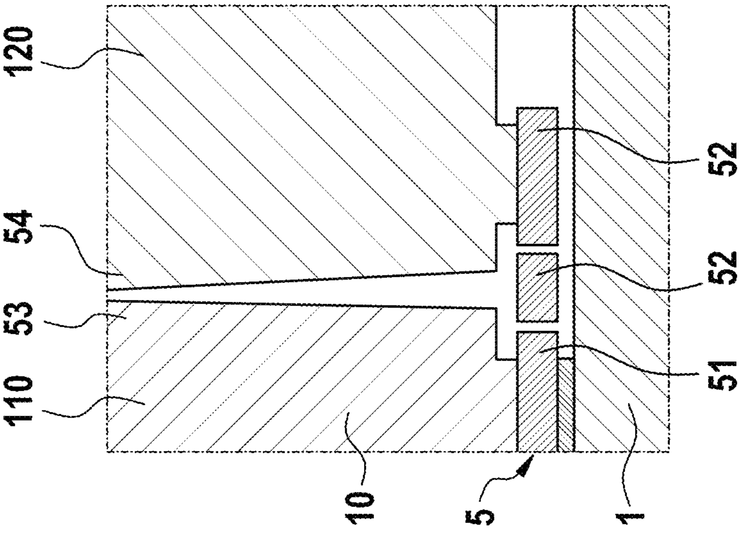
Fig. 6A
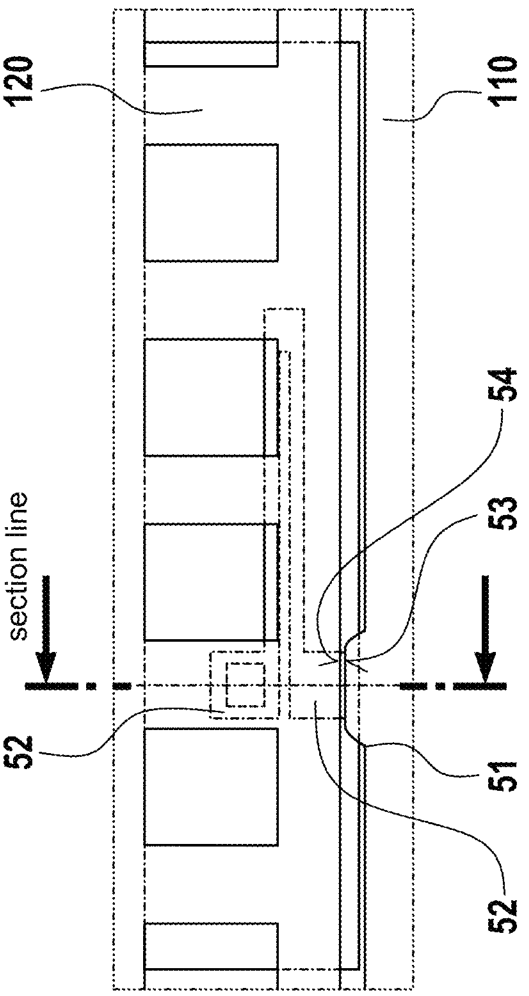

MICROMECHANICAL DEVICE WITH A MECHANICAL STOP

CROSS REFERENCE

The present application claims the benefit under 35 U.S.C. § 119 of German Patent Application No. DE 10 2023 205 883.9 filed on Jun. 22, 2023, which is expressly incorporated herein by reference in its entirety.

BACKGROUND INFORMATION

MEMS yaw rate sensors have moderate to poor shock robustness, depending on their design. If a smartphone with a yaw rate sensor falls to the ground, the yaw rate sensor will usually remain intact provided the drop height is not excessive. However, the mechanical impact can cause particles to form inside the yaw rate sensor, and these particles can lead to failure of the yaw rate sensor in the long term. It would be desirable to have yaw rate sensors that are not destroyed even under relatively high loads and that do not tend to form particles even under moderate loads.

The present invention is based on a micromechanical device having a substrate with a main extension plane (x, y), having a thin first functional layer over the substrate, having a thick second functional layer over the first functional layer, wherein a fixed functional element and a movable functional element are formed in the second functional layer, wherein the movable functional element is able to deflect in a first direction parallel to the main extension plane.

German Patent Application No. DE 19 537 814 A1 describes a method for producing surface-micromechanical sensors, such as acceleration sensors and yaw rate sensors. This and similar methods are used to generate movable silicon structures, the movements of which are measured by determining changes in capacitance (see also FIG. 1).

Conventional surface micromechanical yaw rate sensors are based on the concept of linearly deflected seismic masses. Two masses, namely movable surface-micromechanical structures, are deflected in an anti-parallel manner. The Coriolis force deflects the masses perpendicularly to the direction of movement. The deflection is measured and corresponds to the yaw rate to be measured. An example of a three-axis yaw rate sensor is shown in FIG. 2. FIGS. 3A-3C show a cross-section in the Y direction through the detection combs of such a yaw rate sensor. The distance between the movable structure and the counter-electrodes connected to the substrate is kept as short as possible in order to achieve a high capacitive signal. The attachment of the counter-electrodes to the substrate is kept as narrow as possible in order to be able to arrange as many detection combs as possible in a small area.

In order to achieve a high sensitivity, the movable mass must be mounted softly in the Y direction in order to allow a large deflection. On the other hand, the distance between the movable mass and the fixed electrodes must be short in order to achieve a strong capacitive signal. Furthermore, the functional layer from which the movable structures and fixed electrodes are structured should be as thick as possible to allow a large mass in the movable structure in order to generate a correspondingly large Coriolis force on the one hand and on the other to allow the largest possible electrode areas in order to achieve a strong capacitive signal.

A trenching process with a negative profile, i.e., a trench width that widens toward the bottom in the upper etching region, is preferably used to structure the movable and fixed structures from the functional layer. Such etching processes are particularly insensitive to process scattering caused, for example, by different etching environments. Furthermore, such an etching process can be controlled very well, since in this case the upper region of the etching, i.e. the region with the narrowest opening, can be monitored very well with a microscope or an SEM. With other forms of trench etching, however, monitoring the etching process is difficult.

The critical aspect of this arrangement is that, in the event of a shock load, the movable structures collide with the fixed electrodes and tear out of their anchoring to the substrate. The effect is particularly great with small electrode spacings, narrow attachments with high functional layer thicknesses and negative trench profiles. All of these desired properties ensure that fixed electrodes preferably break off when subjected to shock loads.

SUMMARY

An arrangement is sought for a micromechanical device with robust stop elements for stopping a movable functional element.

The present invention is based on a micromechanical device having a substrate with a main extension plane (x, y), having a thin first functional layer over the substrate, having a thick second functional layer over the first functional layer, wherein a fixed functional element and a movable functional element are formed in the second functional layer, wherein the movable functional element is able to deflect in a first direction parallel to the main extension plane.

According to the present invention, the micromechanical device has a fixed stop element in the first functional layer, the movable functional element is also formed in the first functional layer and has a movable stop element there, wherein the movable stop element can be abutted against the fixed stop element when the movable functional element is deflected in the first direction.

An advantageous example embodiment of the present invention provides for the fixed stop element to be fastened to the substrate or even to the fixed functional element. The advantage of this is that a great deal of design freedom is possible in the design of the micromechanical device.

An advantageous example embodiment of the present invention provides for the fixed stop element or even the movable stop element to be resilient in the first direction by means of a spring element. This is an advantageous way of creating a soft stop or combining a soft and a hard stop. Advantageously, a spring element in the thin first functional layer can be very soft.

An advantageous example embodiment of the present invention provides for the micromechanical device to have, in the second functional layer, a further fixed stop element, which is arranged on the fixed functional element, or even to have a further movable stop element, which is arranged on the movable functional element, wherein the movable functional element can be abutted against the fixed functional element in the event of a deflection in the first direction. This is an advantageous way to create a combined stop. Torques on the fixed functional element are advantageously avoided, particularly when the stop elements and further stop elements strike against each other at the same time.

An advantageous example embodiment of the present invention provides for the device to be a yaw rate sensor, wherein the movable functional element is a sensor mass, and the first direction is a deflection direction of the sensor mass for detecting a yaw rate. Advantageously it is precisely the sensor mass of a yaw rate sensor, which sensor mass is resiliently attached very softly for high sensitivity, that can be protected by the stop elements according to the present invention from damage caused by shock events.

According to an example embodiment of the present invention, it is advantageous if a distance between the fixed stop element and the movable stop element is at least 5% less than a trench width between the fixed functional element and the movable functional element, in particular between movable and fixed electrodes.

According to an example embodiment of the present invention, it is advantageous if the second functional layer is at least three times thicker than the first functional layer.

According to an example embodiment of the present invention, it is advantageous to design the fixed stop element and the movable stop element in the first functional layer in such a way that after a soft stop at least a second, harder stop becomes active before an impact occurs between the movable and the fixed electrodes.

It is advantageous to produce the stops using the production method described in German Patent No. DE 1020 11 080 978 B4.

According to an example embodiment of the present invention, it is advantageous for the first functional layer to be thicker than the distance and thus than the freedom of movement of the movable functional element upward and downward.

The new stop is very robust because it is close to the substrate and therefore only a low torque is transferred to the attachment in the event of an impact.

Due to the initially resilient design of the stop, energy can be initially absorbed in the spring in the event of a shock. As a result, the maximum impact forces can be reduced well, so that a breaking-off of the stop structure and also a breaking-away of parts of the stop structure and thus a particle formation in the micromechanical device can be avoided.

The resilient design of the stop means that, in the event of a shock, the movement of the yaw rate sensor in its drive direction is not braked abruptly but decelerated slowly by the resilient stop. This also allows the energy in the drive movement of the yaw rate sensor to be dissipated slowly and in a defined manner in the event of a shock.

The resilient stop increases the restoring force for shock processes in which the movable structure is driven into the second hard stop and could get stuck there.

The stop elements according to the present invention can be positioned underneath the functional layer without taking up any space.

In MEMS production processes that already create a thin functional layer underneath a thick functional layer, the stop elements according to the present invention can be installed without additional process effort.

Much more precise and smaller trench widths can be defined in the first functional layer because this functional layer is significantly thinner than the second functional layer. For the creation of a yaw rate sensor, this means that the trench widths and thus the distances between the movable functional element and the opposite detection electrodes do not have to be widened to be able to produce stops. The capacitive structures therefore retain a high sensitivity.

The attachments of the fixed electrodes can be made significantly smaller because they no longer have to be designed to stop the movable structure.

With the present invention, yaw rate sensors in particular can be designed to be very shock-resistant. This makes it possible to produce yaw rate sensors that are not destroyed even under high loads and that do not tend to form particles under moderate loads. The first functional layer is already present in established MEMS manufacturing processes. For this reason, no additional process steps are required to produce the new stop elements proposed here, and no additional costs are associated with them. The established production process makes it possible to produce stops in the first functional layer that are suitable precisely for the preferred trench widths.

BRIEF DESCRIPTION OF THE DRAWINGS

FIGS. 3A to 3C show details of a micromechanical device with a mechanical stop in the related art.

FIGS. 6A and 6B show details of a micromechanical device according to the present invention with a mechanical stop in a third exemplary embodiment of the present invention.

DETAILED DESCRIPTION OF EXAMPLE EMBODIMENTS

Figure 1:
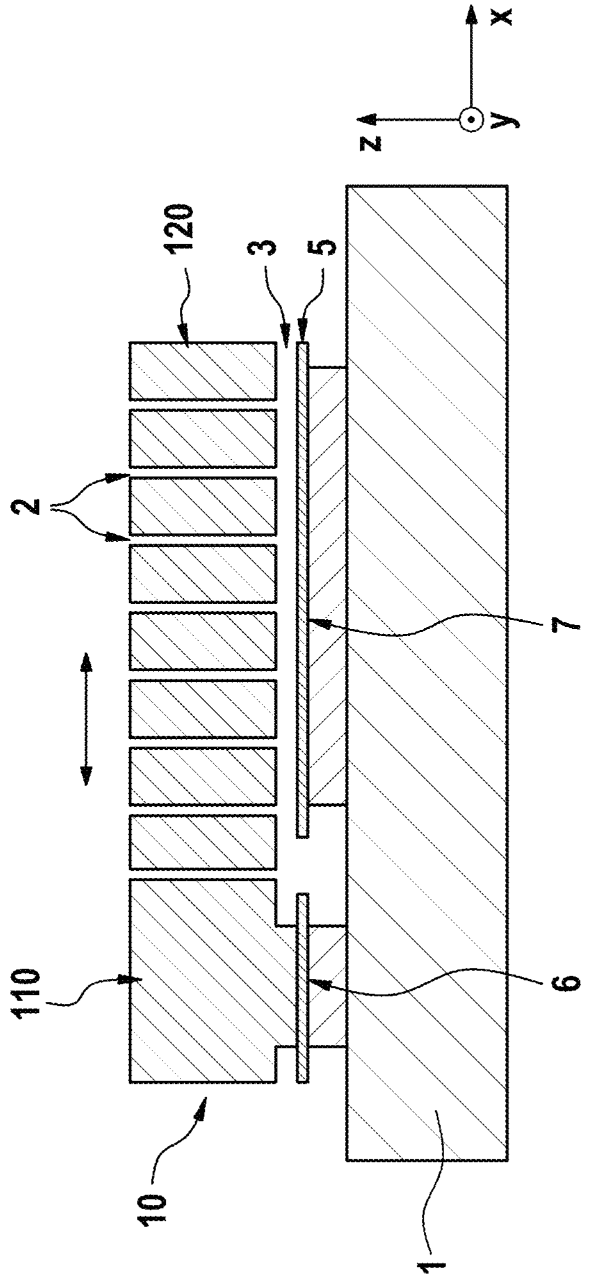
FIG. 1 Related Art
FIG. 1 shows a side view of the structure of a micromechanical device in the related art.

FIG. 1 shows a side view of the structure of a micromechanical device in the related art. A surface micromechanical device is shown, having a substrate 1 with a main extension plane (x, y), having a thin first functional layer 5 over the substrate, having a thick second functional layer 10 over the first functional layer, wherein a fixed functional element 110 and a movable functional element 120 are formed in the second functional layer, wherein the movable functional element is able to deflect in a first direction parallel to the main extension plane.

The movable silicon structures 120 can be created in a first step by an etching method, wherein trenches 2 are produced with a high aspect ratio in the silicon layer, as disclosed in DE 4241045. In a second step, a sacrificial layer 3, usually an oxide layer, is removed from under the thick silicon layer 10, as can be seen in DE 4317274 and DE 1970445. This results in silicon structures that are freely movable in relation to the substrate. A thin polysilicon layer 5 can be arranged under the movable structures. The polysilicon layer can be used as an attachment 6 for the movable or fixed silicon structures or as an electrode 7 under the movable structures or as a conductor track 8.

Figure 2:
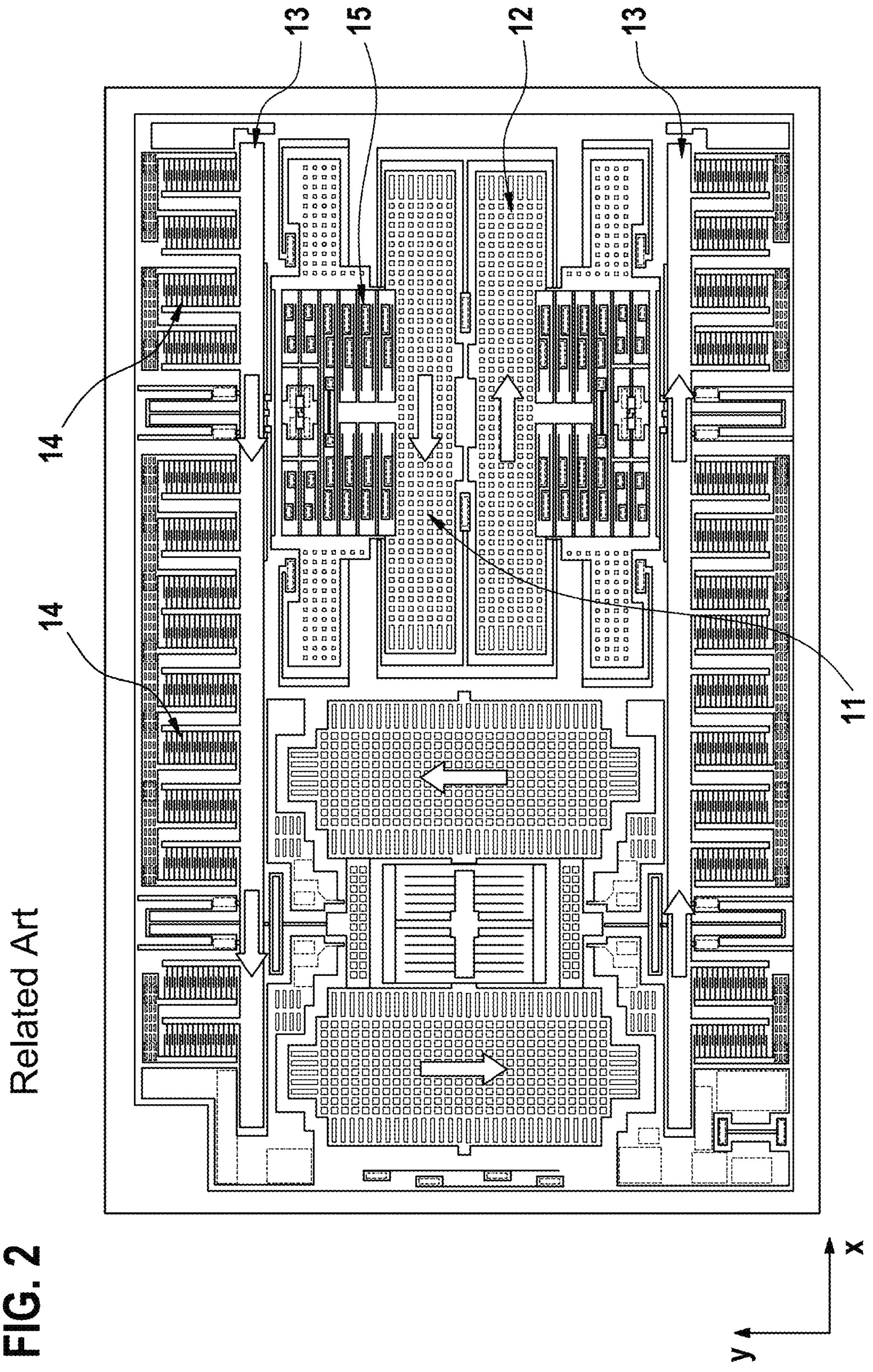
Related Art FIG. 2
FIG. 2 shows a top view of the structure and mode of operation of a MEMS yaw rate sensor in the related art.

FIG. 2 shows a top view of the structure and mode of operation of a MEMS yaw rate sensor in the related art. A two-part drive frame 13 is driven by electrostatically driven comb structures 14 to execute an anti-parallel movement in the X direction.

To detect a yaw rate in the Z direction, two masses 11, 12 are moved in the X direction via coupling springs. Typically, the masses are excited to oscillate with a deflection of between 10 and 20 μm. The movable MEMS structures are arranged in the sensor in a vacuum so that the two masses 11, 12 form a high-quality oscillator and can be excited to oscillate in the X direction via resonant excitation.

If there is a yaw rate in the Z direction, the masses will be deflected in the Y direction by Coriolis force. The deflection can be measured via electrodes located under the two masses. The deflection of the detection masses can be determined electrostatically using pairs of electrodes 15 that are fastened to the substrate and arranged a short distance apart in the Y direction.

FIGS. 3A to 3C show details of a yaw rate sensor with a mechanical stop in the related art.

FIGS. 3A and 3B show a top view of the structure and mode of operation of the stop in the related art. The stop 20 in the thick functional layer 10 limits the path of the movable structure 120 before it can collide with fixed detection electrodes 23.

FIG. 3C shows a side view (at the section line) of the mode of operation of a stop in the related art. Visible in particular are the negative trench profile, which opens toward the substrate, and the resulting punctiform stop 21 in the upper region of the functional layer of the movable functional element 120, which stop causes a high torque on the attachment of the fixed functional element 110 on the substrate 1 in the event of an impact. The high torque can cause the fixed functional element to break off. The punctiform stop 21 can lead to material being knocked out of the upper functional layer 10 and thus to the formation of particles.

It can also be seen that such a stop can only be arranged laterally next to the detection electrodes 23 and thus, on the one hand, additional space is required in the sensor and, on the other hand, in the event of very strong shock events, the connection region as far as the stop point can twist and thus an impact can also occur between the electrodes, for example.

Figure 4C:
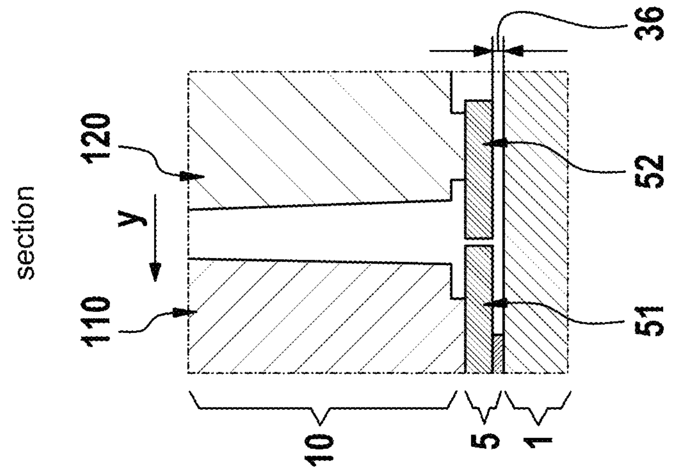
FIGS. 4A to 4C show details of a micromechanical device according to the present invention with a mechanical stop in a first exemplary embodiment of the present invention.
Figure 4A:
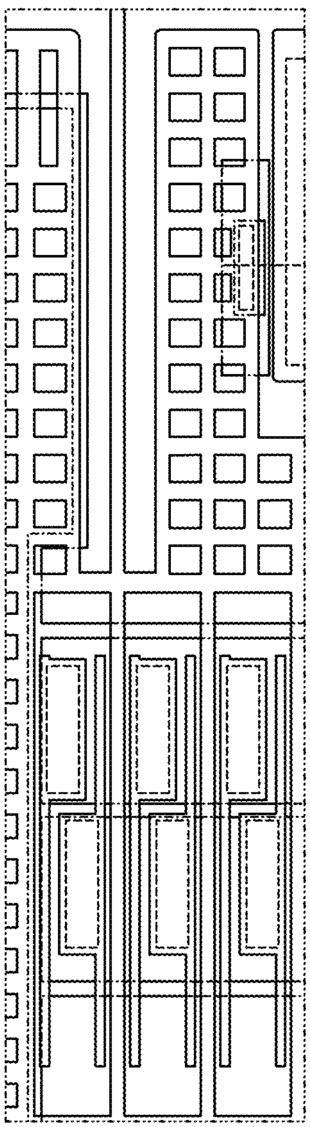
Figure 4B:
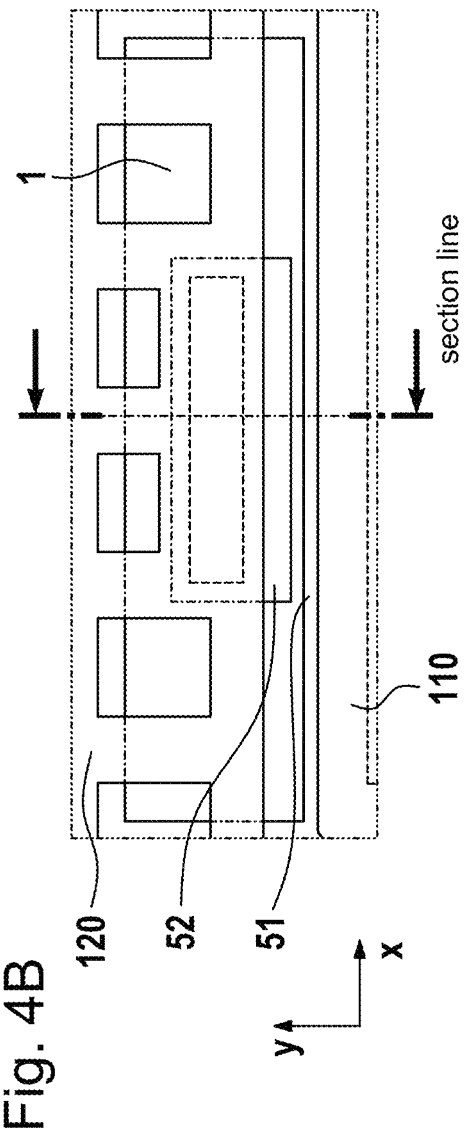

FIGS. 4A to 4C show details of a micromechanical device according to the present invention with a mechanical stop in a first exemplary embodiment.

A thin first functional layer 5 is arranged over a substrate 1 with a main extension plane (x, y) by means of further layers. A thick second functional layer 10 is arranged over the first functional layer, wherein a fixed functional element 110 and a movable functional element 120 are formed in the second functional layer. The movable functional element is able to deflect in a first direction y parallel to the main extension plane. The micromechanical device has a fixed stop element 51 in the first functional layer. The movable functional element has, in the first functional layer, a co-movable stop element 52, which can be abutted against the fixed stop element when the movable functional element is deflected in the first direction y.

FIG. 4C shows a side view of a detail of the micromechanical device according to the present invention in the region of the stop elements.

The fixed stop element 51 simultaneously forms an anchorage of the fixed functional element 110 on the substrate 1. Alternatively (not shown), the fixed stop element can also be connected only to the overlying fixed functional element or only to the underlying substrate. The movable stop element 52 is fixedly connected to the overlying movable functional element 120.

It is favorable if the thickness of the first functional layer 5 is greater than the mobility of the movable functional element 120 upward and downward, i.e., perpendicularly to the main extension plane (x, y) of the substrate. This prevents the stop from snagging in the event of an out-of-plane movement. In this example, the downward mobility is provided by the distance 36 between the first functional layer 5 and the underlying substrate 1. The upward mobility can be limited accordingly by a stop in a cap arranged above it (not shown) and can be selected in such a way that snagging in this direction can also be prevented.

Figure 5C:
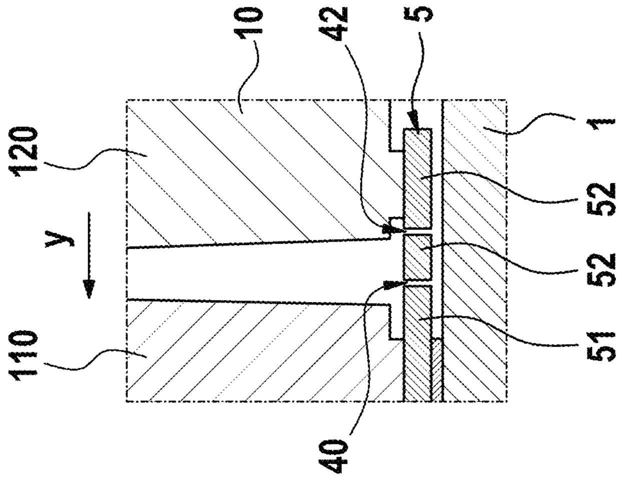
FIGS. 5A to 5C show details of a micromechanical device according to the present invention with a mechanical stop in a second exemplary embodiment of the present invention.
Figure 5A:
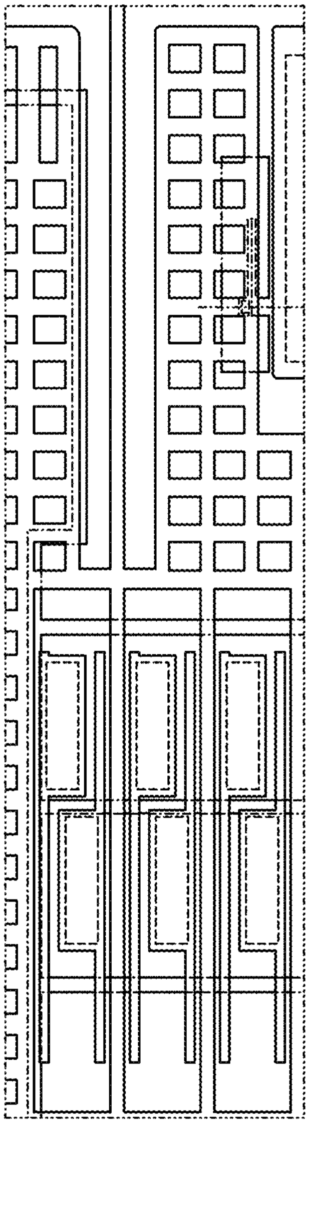
Figure 5B:
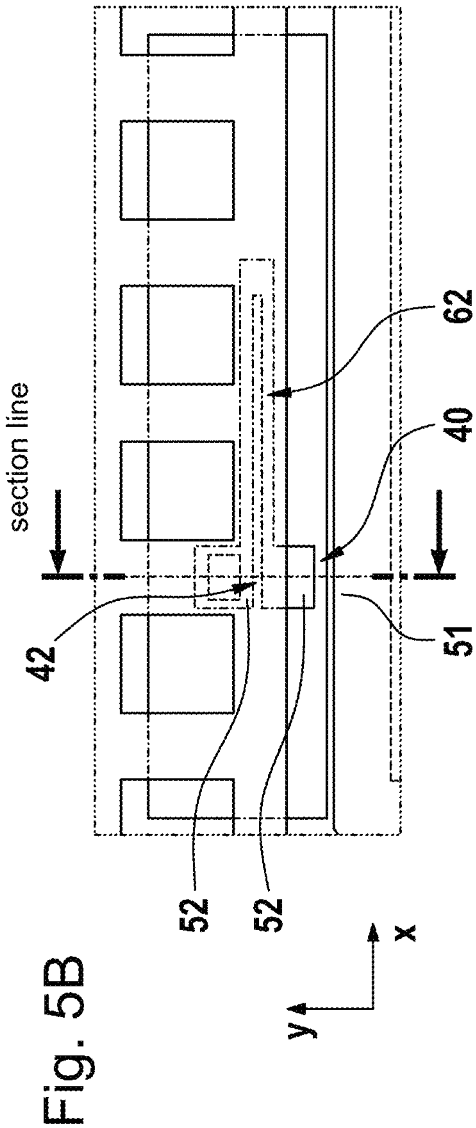

FIGS. 5A to 5C show details of a micromechanical device according to the present invention with a mechanical stop in a second exemplary embodiment.

FIGS. 5A and 5B show a top view of an embodiment of the micromechanical device with stop elements according to the present invention with a combined soft and hard stop. A particularly favorable embodiment is shown here, in which both functions are realized in one element. When the movable functional element 120 is deflected in the first direction y toward the fixed functional element 110, the fixed stop element 51 comes into mechanical contact with the movable stop element 52 at a first stop point 40. This is a soft stop. There is a further deflection of the movable functional element 120, braked by the spring element 62 integrated in the movable stop element 52. In the event of a further deflection, an impact occurs between two parts of the movable stop element 52 at a second stop point 42. This is a hard stop, and the movable functional element comes to a halt. This arrangement is particularly favorable for a production method according to DE 10 2011 080 978 B4. This production method can be used to produce narrow trenches in the first functional layer. Medium trench widths cannot be produced. Large trench widths can however be produced. With this arrangement, a hard stop that only goes into stop after twice the width of the small trench width that can be produced can therefore be produced in a favorable way. The method can be extended accordingly to further multiples of the small trench width.

FIG. 5C shows a side view of the stop elements according to the present invention with the combined soft and hard stop.

FIGS. 6A and 6B show details of a micromechanical device according to the present invention with a mechanical stop in a third exemplary embodiment.

FIG. 6A shows a top view of an embodiment of the micromechanical device with stop elements according to the present invention with a soft and hard stop as well as conventional further stop elements. For this purpose, the micromechanical device has, in the second functional layer 10, a further fixed stop element 53, which is arranged on the fixed functional element 110, and a further co-movable stop element 54, which is arranged on the movable functional element 120. When the movable functional element is deflected in the first direction y, the movable stop element 52 is initially abutted against the fixed stop element 51. With further deflection in the first direction y, the spring element of the movable stop element is compressed. With an even further deflection in the first direction y, the movable functional element 120 can be abutted against the fixed functional element 110. In particular, if the trench width is approximately the same, the two stop elements 51, 52 and the two conventional further stop elements 53, 54 can come into contact with each other simultaneously in the event of a shock. This is also possible for non-resilient stops. The impact takes place simultaneously in the first and second functional layers. As a result, there is virtually no torque in the event of an impact.

FIG. 6B shows a side view of the stop elements according to the present invention with the soft and hard stop combined with the conventional stop elements.

It is clear that the new stop can be arranged independently of the upper, second functional layer. This makes it possible, for example, to move the stop closer to the detection electrodes in order to protect the detection electrodes particularly well in the event of particularly hard shocks.

Even though only the movable stop element 52 is shown here in a resilient design with a spring element 62, it is self-evident that alternatively or additionally the fixed stop element 51 can also be resilient. This is favorable, for example, if particularly small, compact stop elements are to be realized on the movable functional element 120.

LIST OF REFERENCE SIGNS

1 Substrate
2 Trench
3 Sacrificial layer
5 Thin first functional layer
6 Anchoring
7 Electrode
10 Thick second functional layer
20 Stop
21 Punctiform stop
23 Detection electrode
40 First stop point
42 Second stop point
51 Fixed stop element
52 Movable stop element
53 Further fixed stop element
54 Further movable stop element
62 Spring element
110 Fixed functional element
120 Movable functional element

What is claimed is:

1. A micromechanical device, comprising:

a substrate with a main extension plane;

a thin first functional layer over the substrate;

a thick second functional layer over the first functional layer, wherein a fixed functional element (110) and a movable functional element are formed in the second functional layer, wherein the movable functional element is able to deflect in a first direction parallel to the main extension plane;

a fixed stop element in the first functional layer, the movable functional element is also formed in the first functional layer and has a movable stop element in the first functional layer, wherein the movable stop element can be abutted against the fixed stop element when the movable functional element is deflected in the first direction.

2. The micromechanical device according to claim 1, wherein the fixed stop element is fastened to the substrate and/or to the fixed functional element.

3. The micromechanical device according to claim 1, wherein the fixed stop element and/or the movable stop element is resilient in the first direction using a spring element.

4. The micromechanical device according to claim 1, wherein the micromechanical device has: (i) in the second functional layer, a further fixed stop element, which is arranged on the fixed functional element, and/or (ii) a further movable stop element, which is arranged on the movable functional element, wherein the movable functional element can be abutted against the fixed functional element in the event of a deflection in the first direction.

5. The micromechanical device according to claim 1, wherein the micromechanical device is a yaw rate sensor, wherein the movable functional element is a sensor mass, and the first direction is a deflection direction of the sensor mass for detecting a yaw rate.

* * * * *